United States Patent [19]

Kawama et al.

[11] Patent Number: 5,016,279
[45] Date of Patent: May 14, 1991

[54] SPEECH ANALYZING AND SYNTHESIZING APPARATUS USING REDUCED NUMBER OF CODES

[75] Inventors: Shuichi Kawama, Kyoto; Yoshiji Fujimoto, Nara, both of Japan

[73] Assignee: Sharp Kabushiki Kaisha, Osaka, Japan

[21] Appl. No.: 395,204

[22] Filed: Aug. 16, 1989

Related U.S. Application Data

[63] Continuation of Ser. No. 249,000, Sep. 26, 1988, abandoned.

[30] Foreign Application Priority Data

Sep. 26, 1987 [JP] Japan .................................. 62-241571

[51] Int. Cl.$^5$ ............................................... G10L 7/02
[52] U.S. Cl. ..................................................... 381/36
[58] Field of Search ........................................ 381/29-40; 364/513.5; 375/25-27, 31, 34, 122

[56] References Cited

U.S. PATENT DOCUMENTS

| | | | |
|---|---|---|---|
| 4,726,037 | 2/1988 | Jayant | 381/30 |
| 4,734,768 | 3/1988 | Pexa | 375/27 |
| 4,744,085 | 5/1988 | Fukatsu | 375/27 |
| 4,797,653 | 1/1989 | Takayama | 375/27 |

Primary Examiner—Dale M. Shaw
Assistant Examiner—John A. Merecki
Attorney, Agent, or Firm—Flehr, Hohbach, Test, Albritton & Herbert

[57] ABSTRACT

A speech analyzing and synthesizing apparatus samples a speech signal and its coding section outputs one or more codes of variable length per sampling according to the differential value between two mutually adjacent sampled signals to represent this differential value. The apparatus also includes a decoding section which decodes the outputted codes to obtain the differential value and a limiting circuit for limiting the number of outputtable codes per sample according to the differential value and codes representing differential values previously outputted from the coding section.

2 Claims, 4 Drawing Sheets

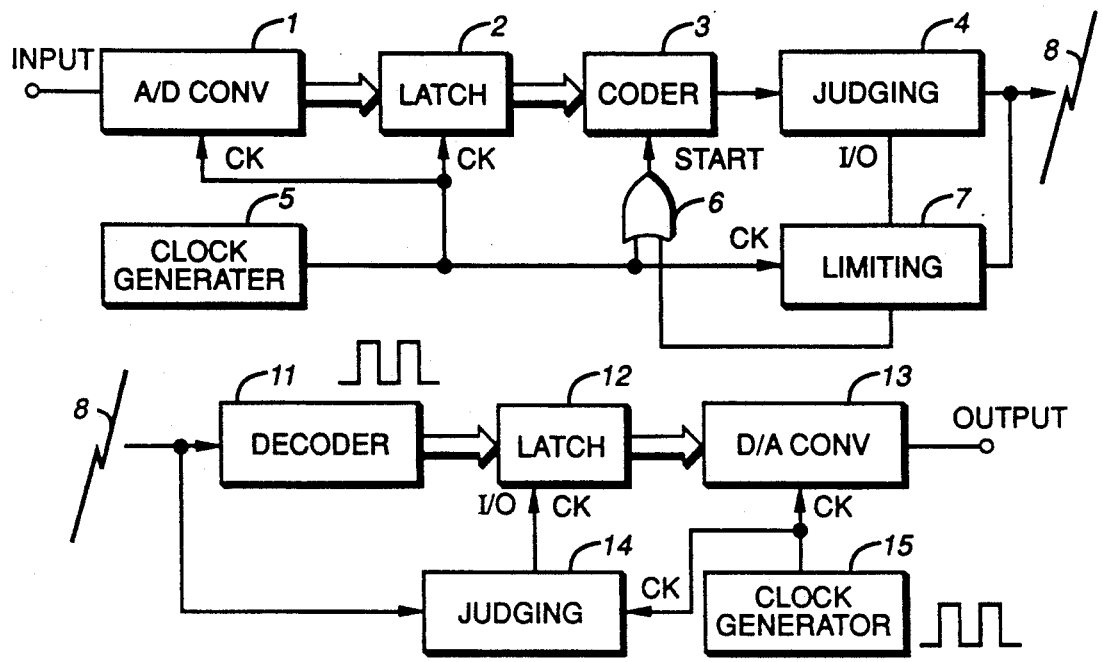
FIG._1
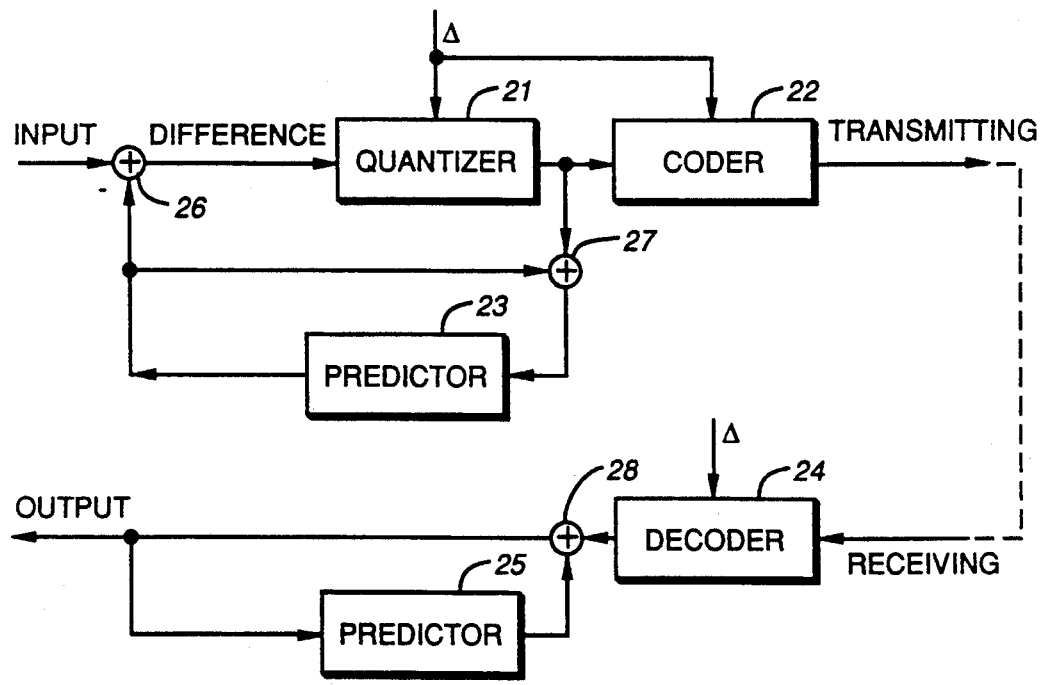
FIG._2

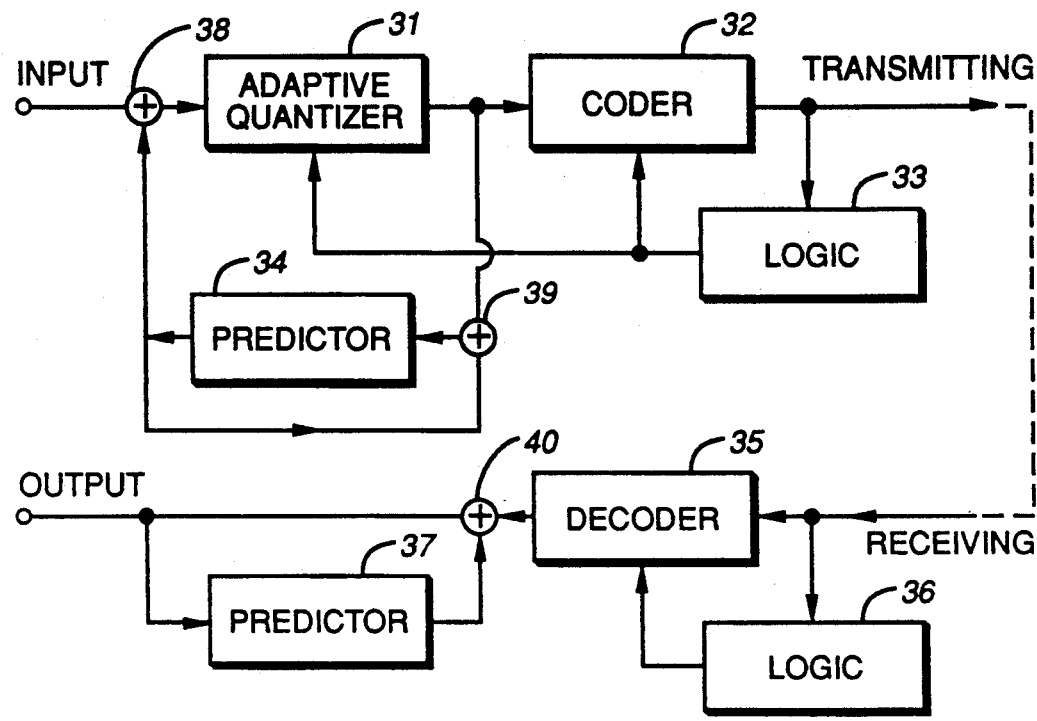
FIG._3
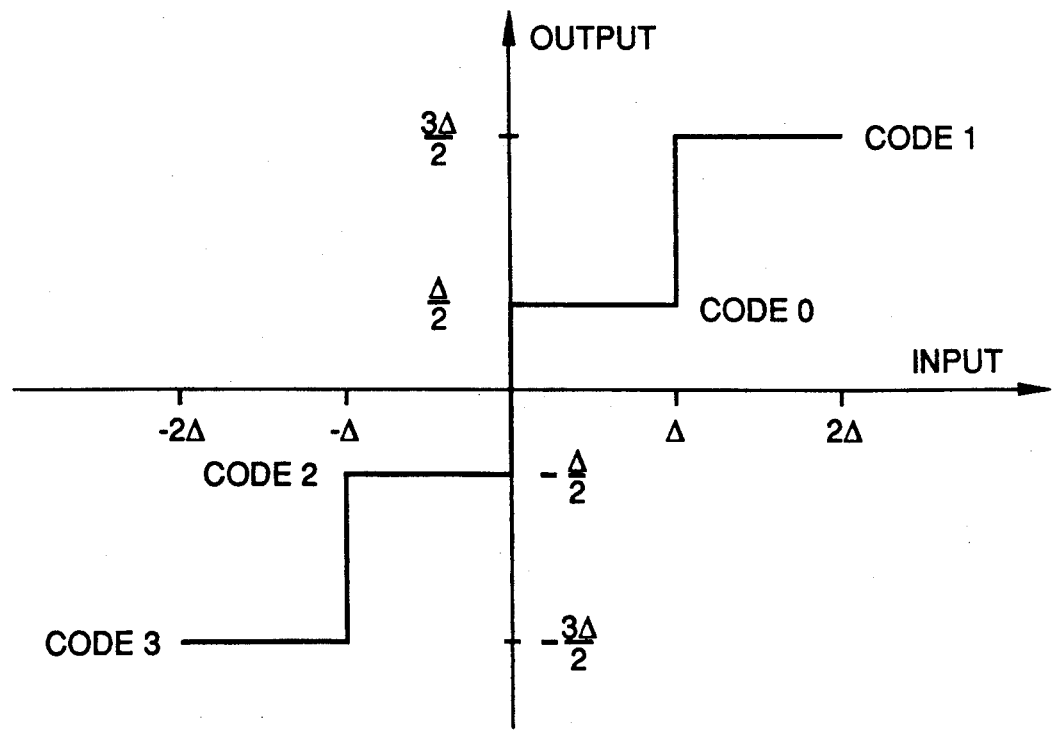
FIG._4

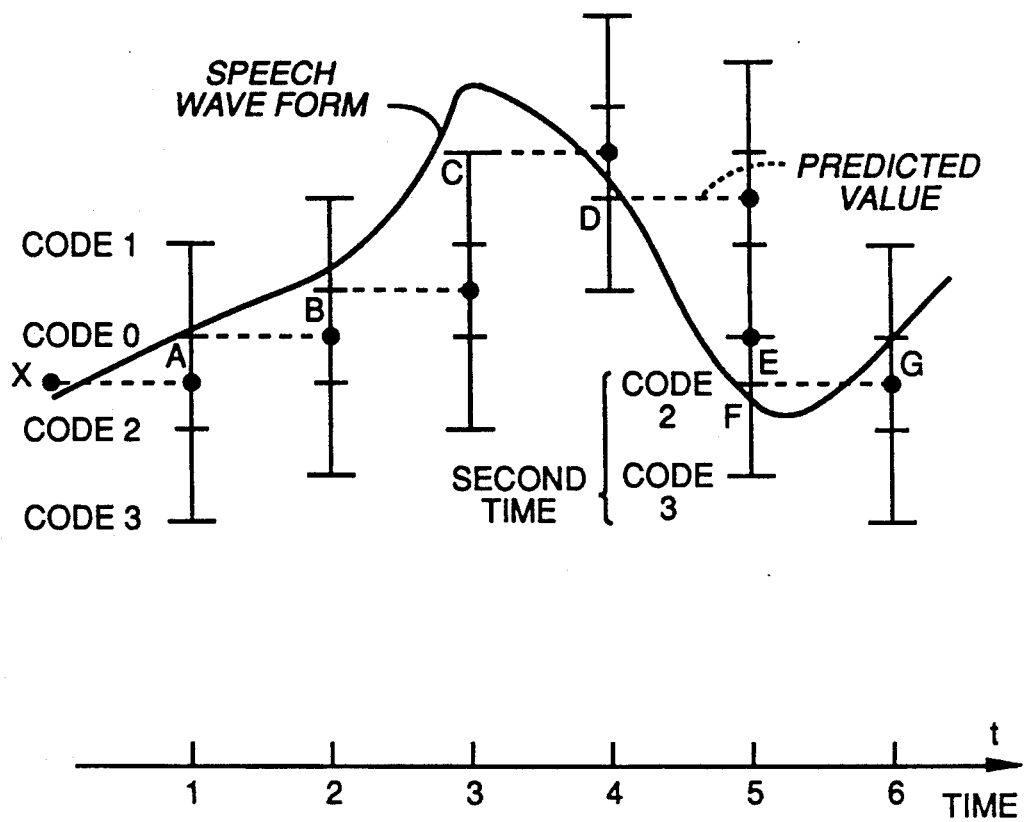
FIG._5

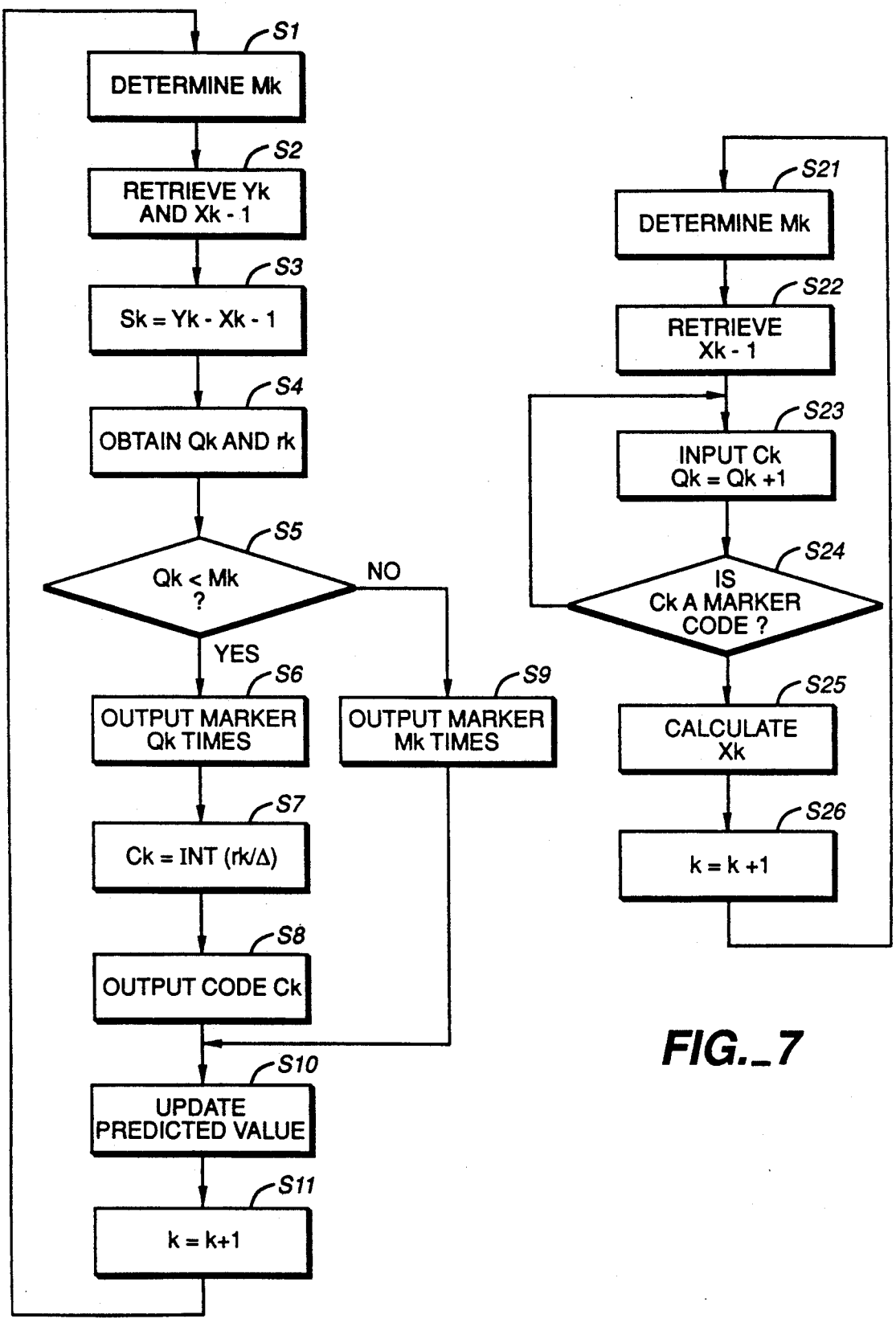
FIG._6
FIG._7

SPEECH ANALYZING AND SYNTHESIZING APPARATUS USING REDUCED NUMBER OF CODES

This is a continuation of U.S. application Ser. No. 249,000 filed Sept. 26, 1988, now abandoned.

BACKGROUND OF THE INVENTION

This invention relates to a speech analyzing and synthesizing apparatus for analyzing a speech signal and coding it by reducing the average code length for the convenience of data transmission and storage.

A large quantity of data is generally required to express a speech signal but speech signals are experimentally known to exhibit a very significant correlation between successive samples. It is because its spectrum distribution has large deviations with high-energy vowels distributed in a low-frequency region of less than 1 kHz and energy associated with consonants distributed in a high-frequency region of above 3 kHz and up to 5-6 kHz. If the sampling frequency is chosen sufficiently high so that consonants can be accurately reproduced, there is oversampling with respect to the high-energy low-frequency vowel components and this means that correlations between adjacent sampled values become high.

In other words, speech signals usually include redundancy to a considerable degree. It is therefore desirable to compress them properly such that they can be transmitted with higher efficiency and stored even in a low-capacity memory device.

Methods of coding speech signals can be roughly classified into the waveform coding method and the method of coding in the frequency space. According to the waveform coding method, a fixed number of coded data is outputted, for example, per sample. According to the method of coding in the frequency space, a fixed number of coded data is outputted, for example, per frame. When the waveform coding method is used, it is clearly more advantageous, from the point of view of reducing the total amount of data to be stored, to use a variable-length coding method by outputting a large amount of data where changes in the waveform are large and unpredictable and a smaller amount of data where waveform changes are small and easily predictable. A similar statement is applicable also regarding the method of coding in the frequency space.

Since speech signals have a very high correlation between successive samples and the sample distributions are limited in a narrow range, it is advantageous to consider their differentials instead of directly coding the sampled signal values because the range of quantization can be reduced by considering the differentials. Principles of this technology are disclosed, for example, in "Digital Coding of Speech Waveforms: PCM, DPCM and DM Quantizers" by N. S. Jayant published in the Proceedings of IEEE, Vol 62, No. 5, pp. 611-632 (1974).

Japanese Patent Application entitled Speech Analyzing and Synthesizing Apparatus filed Jan. 16, 1987 and assigned to the present assignee has disclosed a speech analyzing and synthesizing apparatus for reducing the average code length by outputting codes of variable length with a particular one of analyzed codes from an inputted speech signal used as a marker code and by varying the amount of data on the results of coding by a simple operation according to the change in the inputted speech signal. This apparatus is comprised of a differential detection means for detecting differentials between pairs of mutually adjacent sampled speech signals, a judging means for judging whether or not a differential detected by the differential detection means is within a specified range (quantization range, or coding range) inside which it can be coded by a specified number of codes and a coding means for coding a detected differential within this range and, if this detected differential is outside this range, calculating what will hereinafter be referred to as the repetition number of this range (an integer indicative of how many times this range must be extended such that the detected differential value can come within this extended range) for expressing its differential and coding it by a code array inclusive of a marker code representing this repetition number. With an apparatus thus structured, coding is effected within a fixed number of codes if the differential is within the quantization range and with a code array including a marker code representing the repetition number of the range. If the differential is not within the range, however, a marker code expressing the repetition number of the range is outputted. Thus, if it is attempted to reduce the quantization error of differential by reducing the range when the amount of data (bit length) of a specified number of codes is small, there is a significant increase in situations where the differential is not within the range and a code array including a marker code is outputted for each such situation. This means that the average code length cannot be reduced.

SUMMARY OF THE INVENTION

It is therefore an object of the present invention to provide a speech analyzing and synthesizing apparatus which can reduce the average code length and hence does not require a memory with a large capacity. More particularly, it is an object of the present invention to provide a speech analyzing and synthesizing apparatus which, when a differential is not within the quantization range, limits the number of codes which can be outputted per sample on the basis of code array outputted immediately before the current sampling.

A speech analyzing and synthesizing apparatus embodying the present invention, with which the above and other objects can be achieved, not only obtains a differential between mutually adjacent speech signals sampled by a sampling means and carries out coding with variable lengths by outputting from a coding section one or more codes per sample for representing the differential according to its size, but also comprises a decoder for coding the decoded differential and a limiting means for limiting the number of codes that can be outputted per sample on the basis of the size of the aforementioned differential and the codes representing the differential outputted before the current sampling time. For example, the aforementioned limiting means according to the present invention may be adapted to determine the number of codes which can be outputted by judging from a code array whether or not the differential two cycles of sampling before or immediately before the time of the current sampling is within the specified quantization range. Alternatively, the number of outputtable codes may be determined by judging from a code array whether the differential by the current sampling is outside the quantization range, whether that by the immediately preceding sampling is outside the range and whether the two differentials have the same polarity. Alternatively still, it may be determined by judging from a code array whether the differential by the immediately preceding sampling is inside the range. Further alternatively, it may be determined by judging from a code array whether the differentials by sampling two and three cycles before the current sampling or the differential by the immediately preceding sampling is outside the range. Still further alternatively, it may be by a combination of the methods described above.

With a speech analyzing and synthesizing apparatus thus structured, the number of codes which can be outputted per sample is limited by the limiting means, for example, on the basis of the magnitude of the differential between mutually adjacent speech signals sampled by a sampling means and codes outputted before the time of the current sampling. Within the limit thus determined, the coding section outputs one or more codes of variable length per sample for representing this differential. When the signal thus coded by the coding section to represent the differential is received by the decoding section, the differential is calculated by the decoding section on the basis of this coded signal to obtain synthesized speech. In summary, since the number of outputtable codes per sample for representing a differential is thus limited according to the present invention, the average code length and the required memory capacity for its storage can be further reduced.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a block diagram of a speech analyzing and synthesizing apparatus embodying the present invention, FIG. 2 is a block diagram of a differential PCM (pulse coded modulation) analyzing and synthesizing apparatus, FIG. 3 is a block diagram of an adaptive differential PCM analyzing and synthesizing apparatus, FIG. 4 is a graph showing the relationship between input/output quantization characteristic and output code in the case of mid-riser uniform quantization, FIG. 5 is a graph for explaining the process of coding a speech waveform and output codes, FIG. 6 is a flow chart of coding process in the example explained above, and FIG. 7 is a flow chart of decoding process.

DETAILED DESCRIPTION OF THE INVENTION

FIG. 1 is a block diagram of a speech analyzing and synthesizing apparatus embodying the present invention comprised of a coding section for analyzing and coding a speech signal and a decoding section for synthesizing speech from a coded signal. A speech waveform signal received through an input terminal is converted into a digital signal by an analog-to-digital converter 1 controlled by clock signal CK generated by a sampling frequency oscillator (clock generator) circuit 5. The digital signal thus obtained by the analog-to-digital converter 1 is received by a latch circuit 2 according to the timing of the clock signal CK and kept there until the next sampled speech signal is converted into a digital signal by the next clock signal CK. The clock signal CK is also inputted through an OR circuit 6 to a coder 3 as a start signal by which this coder 3 starts to accept the digital signal stored in the latch circuit 2, to code it and to output the coded signal to a judging circuit 4. As a coder, use may be made of the coder of a differential PCM (pulse code modulation) analyzing and synthesizing apparatus shown in FIG. 2 or that of an adaptive differential PCM analyzing and synthesizing apparatus shown in FIG. 3.

The apparatus shown in FIG. 2 is comprised of a quantizer 21, a coder 22, a first predictor 23 on the coder side, a decoder 24, a second predictor 25 on the decoder side and adders 26, 27 and 28. The quantizer 21 serves to quantize the input signal and output quantized values to the coder 22 and to the adder 27. The coder 22 obtains a code corresponding to the received quantized value and transmits this code. The predictor 23 is for outputting a predicted input value at the time of the next sampling by receiving the sum of the predicted value and the quantized value at the current sampling time. The input received by the quantizer 21 is the difference between the sampled speech signal and the predicted value outputted from the predictor 23. When the signal transmitted from the coder 22 is received, the decoder 24 outputs quantized value corresponding to this code. The two predictors 23 and 25 function similarly. The quantized value outputted from the decoder 24 is added to the predicted value obtained by the predictor 25 and the sum is used for obtaining the next predicted value. The width of quantization (to be explained below) is constant and used by the quantizer 21, the coder 22 and the decoder 24.

The apparatus shown in FIG. 3 is comprised of an adaptive quantizer 31, a coder 32, a logical circuit 33 and a predictor 34 on the coder side, a decoder 35, another logic circuit 36 and a predictor 37 on the decoder side, and adders 38, 39 and 40. As is known by persons skilled in the art, the adaptive differential PCM is an improved method of making the width of quantization variable The adaptive quantizer 31, therefore, functions similarly to the quantizer 21 explained above but the width of quantization is varied at each sampling point. The logic circuits 33 and 36 serve to control the changes of the quantization width according to signals received from the coder 32.

With reference to FIG. 1, the judging circuit 4 serves not only to transmit the inputted voice signal to a communication line 8 or to a recording medium (not shown) and to output it to what is herein referred to as a limiting circuit 7 but also judges whether the received coded signal (code) is an end code indicating either one of the ends of a specified range (within which a measured differential can be coded within a specified number of codes). If the judging circuit 4 concludes that the examined code is an end code and that it is necessary to further output a code subsequent to this end code for coding data from one sampling as will be explained in detail below, this end code is treated as what is herein referred to as a marker code. In the case of an illustrative example shown by the mid-riser uniform quantization characteristic of FIG. 4 where Δ indicates the width of uniform quantization, CODE 1 and CODE 3 are what was referred to above as an end code. In other words, an end code is a code which is outputted when the input signal is too large for the quantization (coding) range.

If the code received by the judging circuit 4 is not an end code, the judging circuit 4 outputs a judgment signal "0". If the examined code is an end code, a signal "1" is outputted to the limiting circuit 7. The limiting circuit 7 stores an array of codes outputted during several preceding sampling cycles. On the basis of such a code array, the limiting circuit 7 preliminarily determines and stores a maximum number of codes into which a sample can be coded and outputted. The limiting circuit 7 also counts the number of times the judgment signal "1" is received from the judging circuit 4 within a sampling cycle or, for example, the number of times an end code CODE 1 or CODE 3 has continued. If this number is less than the aforementioned predetermined maximum number, the end code inputted to the judging circuit 4 is defined as a marker code and the signal "1" is outputted to the OR circuit 6.

If the frequency of occurrence of the judgment signal "1" reaches the aforementioned maximum number, the end code received by the judging circuit 4 is not identified as a marker code and the judgment signal "0" is thereafter outputted to the OR circuit 6. When the next clock signal CK is received, the limiting circuit 7 updates the stored code array and, determining on the basis of this updated code array a new maximum number of codes into which a sample can be coded, starts counting again the number of times the signal "1" is received regarding the next sample.

To explain the above more in detail, if the current sampling point in time is indicated by k, the number of preceding sampling points in time to be considered is N and the number of codes outputted at a point in time t is $n_t$, the code array to be stored in the limiting circuit 7 is $C(1,k-N)$, $C(2,k-N)$, ..., $C(n_{k-N},k-N)$, $C(1,k-N-1)$, ..., $C(n_{k-N-1},k-N-1)$, ..., $C(1,k-1)$, ..., $C(n_{k-1},k-1)$ where $C(i,j)$ indicates the ith code outputted at time j. At the next clock signal CK (or at time k+1), the oldest part of the array $C(1,k-N)$, ..., $C(n_{k-N},k-N)$ is discarded and the new code array at the most recent time (k) is added such that the updated code array is $C(1,k-N-1)$, ..., $C(n_{k-N-1},k-N-1)$, ..., $C(1,k-1)$, ..., $C(n_{k-1},k-1)$, $C(1,k)$, ..., $C(n_k,k)$.

When the judging circuit 4 determines that an inputted code is not an end code, the limiting circuit 7 outputs "0" to the OR circuit 6 and the OR circuit 6 thereupon outputs "0" to stop the operation of the coder 3 until the clock signal becomes "1" to start the next sampling.

If the judging circuit 4 determines that an inputted code is an end code and the limiting circuit 7 determines that the frequency number of "1" outputted from the judging circuit corresponding to one sample is less than the predefined maximum number, on the other hand, coding cannot be effected directly because the inputted signal is not within the range specified for coding. In the case of differential PCM as shown in FIG. 2, therefore, the limiting circuit 7 transmits a start signal "1" to the coder 3 through the OR circuit 6 in order to update the predicted value of the coder 3 from the prediction of the end code updated by the preceded coding as follows to a next predicted value. With the start signal thus received, the coder 3 once again receives the data signal stored in the latch circuit 2, codes it and outputs the coded signal (code). Thereafter, the next predicted value is calculated repeatedly in order to update the predicted value of the coder 3 until the judgment signal becomes "0" because the judging circuit 4 determines that the inputted code is not an end code or the judging circuit 4 determines that the inputted code is an end code and the frequency number of "1" corresponding to one sample counted by the limiting circuit 7 reaches prespecified maximum number such that the end code inputted to the coder 3 ceases to be a marker code.

The operation described above is explained below further in detail by way of an example wherein the waveform is as shown in FIG. 5 and the predefined relationship for the limiting circuit 7 between the maximum number of codes into which a sample can be coded and outputted and the code array outputted in the preceding two cycles of sampling is as shown in Table 1. FIG. 5 also shows the shifting in the range of coding as the predicted value is updated as well as the aforementioned maximum number and the outputted codes.

TABLE 1

| Type | Codes $C_{k-2}$ | $C_{k-1}$ | Maximum Outputtable Codes |
|---|---|---|---|
| 1 |  | CODE 1 or CODE 3 | 2 |
| 2 | CODE 1 or CODE 3 | CODE 0 or CODE 2 | 2 |
| 3 | Other than the above |  | 1 |

Notes:
C = Code outputted first
k = Current sampling time

With reference now to FIG. 5, it is assumed that the code array outputted by the sampling immediately preceding t=1 is of Type 3 according to Table 1 such that the maximum number of outputtable codes at t=1 is 1. At t=1, the coder 3 outputs a first code CODE 0 and shifts the predicted point from X to A. Since the outputted code (CODE 0) is not an end code (CODE 1 or CODE 3), the judging circuit 4 outputs the signal "0" through the limiting circuit 7 to the OR circuit 6. The coder 3 is thereby stopped after calculating this first predicted value until the starting time of the next sampling (t=2).

At t=2, since the code array outputted by the sampling immediately before t=1 corresponds Type 3 according to Table 1 and the code outputted at t=1 is CODE 0, the maximum number of outputtable codes is 1 because the code array outputted during the preceding two sampling cycles corresponds to Type 3 of Table 1 again. The coder 3 outputs CODE 0 at this time and updates the predicted value to B. Since the outputted code is not an end code, the coder 3 is thereafter stopped until the next sampling is started.

At t=3, the maximum number of outputtable codes is again 1 because the code array outputted during the two preceding sampling cycles corresponds to Type 3 according to Table 1. At this time, however, since the change in the speech waveform is too large, the coder 3 outputs CODE 1 which is an end code and the predicted value is updated to C. Thereupon, the judging circuit 4 outputs "1" to the limiting circuit 7 so as to have a second predicted value calculated. Since the maximum number of outputtable codes is still 1 as mentioned above, the frequency number of occurrence of the judgment signal "1" per sampling equals this maximum number. As a result, the limiting circuit 7 does not treat the end CODE 1 as a marker code and outputs "0" through the OR circuit 6 to the coder 3. Thus, the coder 3 does not carry out second coding but stops until the next sampling.

At t=4, the maximum number of outputtable codes becomes 2 because the code which was outputted by the immediately preceding sampling was CODE 1 corresponding to Type 1 according to Table 1. The coder 3 outputs CODE 2 as its code and the predicted value is updated to D. Since the outputted code (CODE 2) is not an end code, the coder 3 stops until the next sampling is started.

At t=5, the code array outputted during the immediately preceding two cycles (CODE 1 at t=3 and CODE 2 at t=4) corresponds to Type 2 according to Table 1 and hence the maximum number of outputable codes becomes 2. At this moment, since the change in the speech waveform is too large, exceeding the range shown in FIG. 4 between CODE 1 and CODE 3, the coder 3 initially outputs the end code CODE 3 and shifts the predicted value to E. Since the inputted code is an end code, the judging circuit 4 outputs "1" to the limiting circuit 7 to have a second predicted value calculated In response, the limiting circuit 7 counts the frequency of occurrence of "1" corresponding to this sampling cycle. Since it is 1 and smaller than the maximum number of outputable codes which is 2 at this time, it transmits "1" to the coder 3 through the OR circuit 6. Thereupon, the coder 3 calculates a predicted value again for coding and outputs CODE 2, updating the predicted value to F. Since this outputted code is not an end code, the coder 3 stops, finishing the operation at t=5. Should an end code such as CODE 3 be outputted by the coder 3 as the result of its calculation for the second time, the coder 3 would still be stopped because no more than the maximum number (=2) of outputable codes can be outputted, the limiting circuit 7 then outputting "0" to the OR circuit 6.

At t=6, the maximum number of outputable codes becomes 2 because one of the two codes outputted from the immediately preceding sampling (at t=5) was CODE 3 and this corresponds to Type 1 according to Table 1. Thus, the coder 3 outputs CODE 0 and the forecast point is updated to G. Since the outputted code is not an end code, the coder 3 stops until the next sampling.

The coding process by the differential PCM method of FIG. 2 is explained next by way of the flow chart of FIG. 6. If i is the number of samples to be referenced, the maximum number $M_k$ of outputable codes per sample at time k is determined at Step $S_1$ on the basis of the code array outputted over a time period expressible as from time $k-i$ to $k-1$. In Step ($S_2$, the waveheight $y_k$ of the speech signal inputted from the latch circuit 2 at time k is retrieved. The predicted waveheight value $x_{k-1}$ calculated at the time of the immediately preceding sampling is internally stored and the differential $S_k$ defined as the difference between $y_k$ and $x_{k-1}$ is calculated in Step $S_3$. In Step $S_4$, the differential $S_k$ is divided by the half-width of the quantization (coding) range R to obtain quotient $Q_k$ and remainder $r_k$. If $Q_k$ is smaller than $M_k$ (YES in $S_5$), a marker code is outputted $Q_k$ times (Step $S_6$). This means that marker codes are outputted until the current waveheight value $y_k$ moves into the quantization range while the predicted waveheight value is shifted. In Step $S_7$, calculation of predicted value is started by calculating $C_k=INT(r_k/\Delta)$ where $\Delta$ is the width of quantization. INT() indicates the largest integer not exceeding the value inside the parentheses. In Step $S_8$, $C_k$ thus calculated is outputted.

If $Q_k$ is not smaller than $M_k$ in Step $S_5$, a marker code is outputted $M_k$ times (Step $S_9$). In other words, the average code length is reduced by outputting a marker signal only $M_k$ (the predefined maximum number) times instead of $Q_k$ times. In Step $S_{10}$, the next predicted waveheight value $x_k$ is calculated by the formula $x_k=x_{k-1}+RQ_k+C_k\Delta$. In Step $S_{11}$, the time indicator k is incremented to prepare for coding from the next sampling.

Regarding the process of analysis described above, it should be noted that the quantization range for the second time is one-half of that for the first time. Accordingly, the bit length of the code for the second time and thereafter is smaller than that for the first time by one bit. If a control circuit is added for controlling the method of updating the predicted value according to the result of coding or another coder having a different quantization range (one-half only) is used for the second time and thereafter, however, codes of the same bit length as at the first time can be outputted.

Next, the decoding operation is explained. With reference to FIG. 1, numeral 11 indicates a decoder which calculates digital data of a synthesized waveform on the basis of codes transmitted through the communication line 8. The decoder 11 uses the decoder of the differential PCM analyzing and synthesizing apparatus shown in FIG. 2 or the decoder of the adaptive differential PCM analyzing and synthesizing apparatus of FIG. 3. Numeral 14 indicates a judging circuit for judging whether a code transmitted through the communication line 8 is an end code or not. If the code which has just been received is not an end code, the judging circuit 14 outputs "1" to a latch circuit 12 and the digital data signal of a synthesized waveform just calculated by the decoder is taken in by the latch circuit 12. This data signal is received by a digital-to-analog converter 13 controlled by the clock signal CK generated by a sampling frequency oscillator (clock generator) circuit 15 and outputted as a synthesized speech waveform. If the received code is judged as an end code, on the other hand, it must be determined whether this end code is a marker code. For this purpose, the judging circuit 14 first determines a maximum number of codes outputable per sample by a method similar to the one explained above and stores this maximum value internally. When an end code is inputted repeatedly, the number of repetition is counted by this judging circuit 14 and until this number reaches the aforementioned maximum number of outputable codes per sample, the judging circuit 14 continues to output "0" to the latch circuit 12. When the number of repetition matches this maximum number, the end code at such a moment is not treated as a marker code and the signal "1" is outputted to the latch circuit 12. In other words, digital data signal of synthesized waveform is not outputted when the received end code is a marker code. At the same time, the predicted value by the differential PCM decoder 11 as shown in FIG. 2 is once updated to another predicted value which is used when digital data signal for synthesized waveform is calculated from the next code. This updated predicted value is stored and the decoder 11 retrieves the next code from the communication line 8 to decode it. When the inputted code ceases to be a marker code, the judging circuit 14 finally outputs "1" and the digital data signal of synthesized waveform is taken into the latch circuit 12. The digital data signal is then converted into an analog signal by the digital-to-analog converter 13 and outputted through an output terminal as synthesized waveform. The clock signal CK from the cock generator 15 not only controls the digital-to-analog converter 13 but also is inputted to the judging circuit 14 and updates the maximum number of outputable codes per sample to be determined by the judging circuit 14.

The decoding process described above is explained next by way of the flow chart of FIG. 7. The maximum number $M_k$ of outputtable codes per sample is determined in Step $S_{21}$ by the same method as explained above in connection with FIG. 6 and the previously obtained synthesized waveheight value $x_{k-1}$ which has been stored is retrieved (Step $S_{22}$). Next, the speech code $C_k$ is inputted and if it is an end code, the frequency number $Q_k$ is incremented by 1 (Step $S_{23}$). This step is skipped if $C_k$ is not an end code but is repeated if the speech code $C_k$ is not only an end code but also identified as a marker code (YES in Step $S_{24}$), that is, if $Q_k$ is smaller than $M_k$. If $Q_k$ is equal to $M_k$ and $C_k$ is not a marker code, $C_k$ is set equal to 0. In Step $S_{25}$, the synthesized waveform is calculated according to the same formula as used in Step $S_{10}$ of FIG. 6 and the time indicator k is thereafter updated (Step $S_{26}$) to decode the code from next sampling time.

When codes with a short bit length are used as shown, for example, in FIG. 4, the coder 3 tends to frequently output end codes such as CODE 1 and CODE 3 even if changes in the inputted waveform are within a range between $\Delta$ and $2\Delta$ or between $-2\Delta$ and $-\Delta$. If such an end code is directly treated as a marker code, the average code length increases because second and subsequent codes are also outputted. In such a situation, however, a prediction can be made on the basis of a code array outputted immediately before. Thus, if the maximum number of outputtable codes is set to 1 in such a situation, there will be no second code outputted and the average code length can be reduced.

Although Table 1 was used above to show a method of determining the maximum number of outputtable codes per sample on the basis of a code array outputted immediately before, this is not intended to limit the present invention. Tables 2, 3 and 4, for example may be substituted for such determination. Table 2 is characterized as relying not only on a code array outputted immediately before but also on the first code outputted from the current sampling in determining the maximum number of codes outputtable at the current time. Alternatively, output of code arrays including wasteful marker codes can be inhibited by making use of a relationship between the code array immediately before and the change in the speech waveform.

TABLE 2

| Type | Code $C_{k-1}$ | Maximum Outputtable Codes |
|---|---|---|
| 1 | CODE 1 (only if $C_k$ = CODE 1) | 2 |
| 2 | CODE 3 (only if $C_k$ = CODE 3) | 2 |
| 3 | Other than the above | 1 |

TABLE 3

| Type | Code $C_{k-1}$ | Maximum Outputtable Codes |
|---|---|---|
| 1 | CODE 1 or CODE 3 | 2 |
| 2 | Other than the above | 1 |

TABLE 4

| Type | $C_{k-3}$ | $C_{k-2}$ | $C_{k-1}$ | Maxmum Outputtable Codes |
|---|---|---|---|---|
| 1 | | | CODE 1 or CODE 3 | 2 |
| 2 | CODE 1 or CODE 3 | CODE 1 or CODE 3 | CODE 0 or Code 2 | 2 |
| 3 | Other than the above | | | 1 |

Notes:
C = Code outputted first
k = Current sampling time

According to still another embodiment of the present invention, an adaptive differential PCM method is used for coding by varying the quantization width when two or more codes are outputted because the change in waveheight value is large or when an end code is outputted. If the quantization width is increased by a constant multiplicative factor, the same effects as by non-linear quantization can be obtained. By this method, the quantization range is broadened and not only can sudden changes in waveform be followed by this method but also the average code length can be kept short while acoustically favorable coding can be effected. Output of code arrays including wasteful marker codes can be further limited if use is made not only of a code array outputted in connection with several immediately preceding cycles of sampling but also of predicted waveheight values of these samples.

What is claimed is:

1. A speech analyzing and synthesizing apparatus comprising a coding section and a decoding section, said coding section including
    a sampling means for successively sampling a speech signal to sequentially output sampled signals,
    a quantizer having a quantization range associated therewith for receiving said sampled signals to output quantized value signals corresponding to said sampled signals, and
    a coding means for receiving said quantized value signals and outputting per sampling a number of codes representing a difference between two or said sampled signals, said number being one or greater and determined according to said difference, said coding means outputting more than one code per sampling if said difference exceeds said quantization range,
    said decoding section including a decoding means for decoding said codes and thereby outputting values each representing said difference, said coding section further including a limiting means for analyzing said codes and limiting said number to be equal to or less than a maximum number, said maximum number being determined by said values and by specified ones of said codes outputted earlier.

2. The apparatus of claim 1 wherein said differential value represents the difference between two mutually adjacent ones of said samples signals.

* * * * *